United States Patent
Swirbel et al.

[11] Patent Number: 5,631,120
[45] Date of Patent: May 20, 1997

[54] METHOD OF FORMING A PATTERN WITH STEP FEATURES IN A PHOTOPOLYMER

[75] Inventors: Thomas J. Swirbel, Davie; Dale W. Dorinski, Coral Springs, both of Fla.

[73] Assignee: Motorola, Inc., Schaumburg, Ill.

[21] Appl. No.: 619,113

[22] Filed: Mar. 20, 1996

Related U.S. Application Data

[63] Continuation-in-part of Ser. No. 300,617, Sep. 2, 1994, abandoned.

[51] Int. Cl.⁶ .................................. G03C 5/00; G03C 5/16
[52] U.S. Cl. .......................... 430/326; 430/327; 430/330; 430/349; 430/394; 430/945
[58] Field of Search ............................ 430/326, 327, 430/330, 349, 394, 945

[56] References Cited

U.S. PATENT DOCUMENTS

| | | | |
|---|---|---|---|
| 3,650,796 | 3/1972 | Jackson et al. | 430/349 |
| 4,054,483 | 10/1977 | Peiffer | 156/632 |
| 4,157,407 | 6/1979 | Peiffer | 427/54 |
| 4,863,827 | 9/1989 | Jain et al. | 430/330 X |
| 5,012,068 | 4/1991 | Anderson | 219/10.55 M |
| 5,223,288 | 6/1993 | Mendenhall et al. | 426/107 |
| 5,236,812 | 8/1993 | Vassiliou et al. | 430/327 |
| 5,238,787 | 8/1993 | Haluska et al. | 430/330 X |

*Primary Examiner*—George F. Lesmes
*Assistant Examiner*—Bernard P. Codd
*Attorney, Agent, or Firm*—Dale W. Dorinski

[57] ABSTRACT

A stepped pattern is formed in a photoresist film (10) by heating the photoresist at a first temperature to soft bake it, and then heating only a selected portion (15) of the photoresist. That portion of the photoresist film is then heated at a temperature sufficient to partially degrade the photoresist. Another portion (22) of the photoresist film is then exposed to ultraviolet light to degrade it more fully than in the earlier step. The photoresist film is then developed under conditions sufficient to completely remove the portion exposed to ultraviolet light, and to partially remove the portion heated in the first step, thereby creating a stepped feature in the photoresist film.

5 Claims, 2 Drawing Sheets

METHOD OF FORMING A PATTERN WITH STEP FEATURES IN A PHOTOPOLYMER

This is a continuation-in-part of application Ser. No. 08/300,617, filed Sep. 2, 1994, and now abandoned.

TECHNICAL FIELD

This invention relates in general to photolithography and more particularly to three-dimensional photolithography.

BACKGROUND

Photopolymers are organic polymers that have the unique property that when exposed to light of an appropriate wavelength, they are chemically changed in their solubility in certain solvents. Photopolymers find use in a number of applications, such as adhesives and photoresists. Photoresists are widely used in the electronic industry in the manufacture of semiconductors and printed circuit boards. Two types of photoresists are available: negative acting and positive acting. Negative acting photoresists are initially soluble in a developing solution, but after light exposure, they become polymerized and insoluble in the developer. Positive photoresists work in exactly the opposite fashion. Exposure to light makes the polymer more soluble in the developing solution. Exposure of photoresists to the light is typically made through a film pattern, or it can be done using a laser or other type of light beam that is rastered across an area. The photoresist pattern that remains after development is insoluble and chemically resistant to other solutions, such as the cleaning, plating, and etching solutions commonly used in producing printed circuit boards.

Since photoresists have typically been used as masking agents for etching and other types of solutions, the developing process for photoresists has been an "all or none" situation. That is, process conditions have been optimized in order to completely remove the photoresist from the desired area during a developing cycle. This provides a hole or opening in the photoresist so that the underlying substrate, if any, is exposed. While this is a desirable situation for the production of semiconductors and printed circuit boards, it provides a severe limitation on photoresists that allows them to only be used in these types of applications. It would be highly desirable if a three-dimensional structure could be fabricated using a photoresist, thereby opening the field to many more applications and uses for photopolymers.

SUMMARY OF THE INVENTION

Briefly, according to the invention, there is provided a method of forming a pattern in a photopolymer. A layer of a photopolymer film is heated at a first temperature, and then selected portions of the photopolymer film are heated at a higher temperature than the first temperature. Additional portions of the photopolymer film are then exposed to ultraviolet light, and the treated photopolymer film is developed to completely remove the portions that were exposed to light and to partially remove the portions that were heated at the higher temperature.

DETAILED DESCRIPTION OF THE PREFERRED EMBODIMENT

Figure 1:
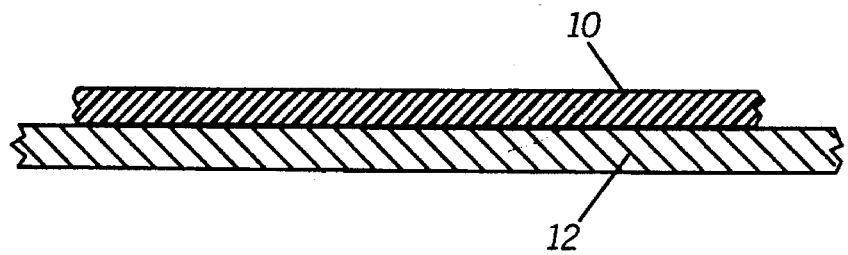
FIGS. 1–5 are cross-sectional views of the various steps in the method of forming a pattern in a photopolymer in accordance with the invention.

While the specification concludes with claims defining the features of the invention that are regarded as novel, it is believed that the invention will be better understood from a consideration of the following description in conjunction with the drawing figures, in which like reference numerals are carried forward. In order to more clearly illustrate selected elements, the drawing figures have intentionally not been drawn to scale.

Figure 2:
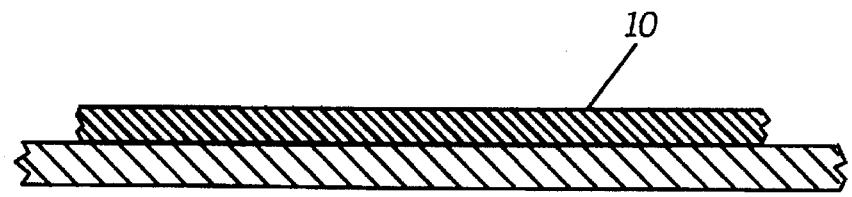
Figure 6:
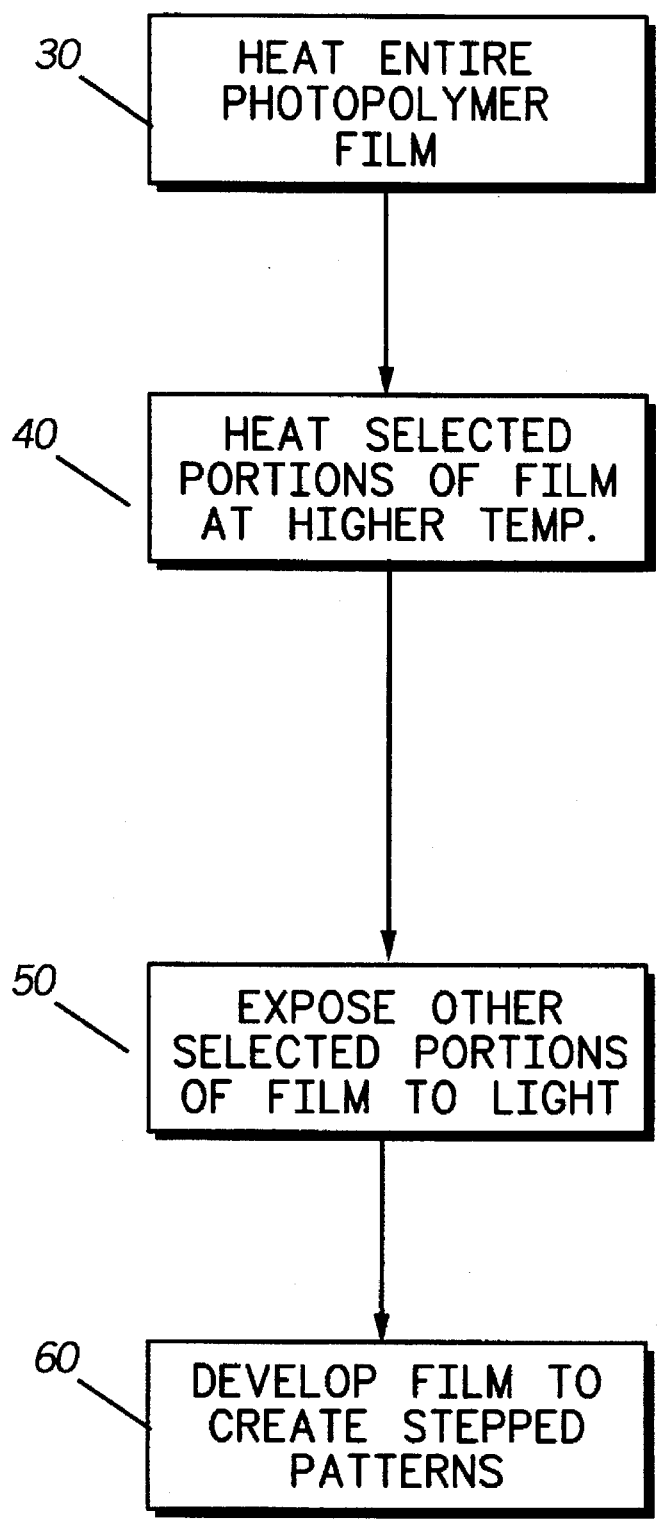
FIG. 6 is a flow chart of the method in accordance with the invention.

In FIG. 6 and specifically now in FIG. 1, a layer of a photopolymer 10, such as a film or layer of photoresist, is provided. Some positive acting photoresists are sold under the AZ series name by Shipley Co. of Newton, Mass. and American Hoechst, with AZ 4620 from American Hoechst being the preferred embodiment. The photoresist 10 may be a free standing film or it may be laminated to an underlying substrate 12. In the case of the manufacture of printed circuit boards or semiconductors, the underlying substrate is typically a piece of copper-clad FR-4 or a silicon wafer. In other applications, it may be a sheet of metal or another type of underlying support structure such as TEFLON®, which would provide easy release of the photopolymer film 10. In FIG. 2, the photopolymer film 10 is heated to a first temperature. This step 30 is often referred to by those skilled in the art as a 'soft bake.' In the case of positive photoresists such as the AZ series, this is typically done at 50°–90° C. The soft bake serves to remove solvents and also to dry and set the photoresist. The soft bake cycle typically runs from two minutes to one hour depending upon the temperature and the thickness of the photoresist. Heating is typically provided by a convection oven or a hot plate, however, other sources of heating such as infrared or conduction heating may be used.

Figure 3:
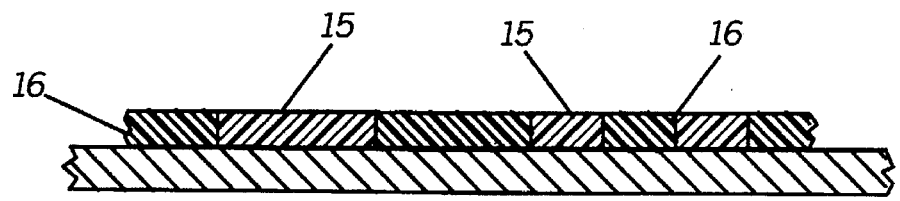

Referring now to FIG. 3, selected portions 15 of the photoresist 10 are heated further. This heating step 40 serves to partially degrade the selected portions 15 of the photoresist 10, thereby rendering them more soluble in a developing solution. Other portions 16 are not heated.

The portions 15 are selectively heated by, for example, a beam of light from a laser. The reader will appreciate that lasers are well known to emit light in several portions of the spectrum. For example, lasers can emit light in the ultraviolet region, the visible region, the infrared region or in two or more of these regions. In the preferred embodiment, ultraviolet light is used, as the photoresist is most sensitive to ultraviolet light, typically from 200–600 nanometers, with 365 nanometers preferred. However, broad spectrum lasers that emit light over a wide range of frequencies may also be used as long as they contain enough light in the ultraviolet frequencies to react the photoresist, and are known simply as 'lasers', without referring to any specific wavelength. Lasers are also easily controlled so as to impinge only on certain areas while avoiding others, for example by rastering. Techniques for selectively heating certain portions of a film are well known and commonly used in the laser industry, and need not be addressed here. Since the laser can be precisely controlled, the amount of heating and exposure to light can also be easily and precisely controlled, in the x, y, and z dimensions, that is to say, both laterally and vertically through the photoresist. The operational parameters of the laser are controlled accordingly so as to only heat the photoresist to a desired depth. Regardless of the method of heating, the heating step creates a latent image that ultimately results in partial developing of the photoresist layer. This renders those portions 15 of the photoresist film 10 somewhat more soluble in a developing material than the unheated portions 16. Typically, the portions 15 are heated to a temperature higher than that used in FIG. 2, for example 90°–120° C. for 30 seconds to 5 minutes, with about 3 minutes being preferred.

Figure 4:
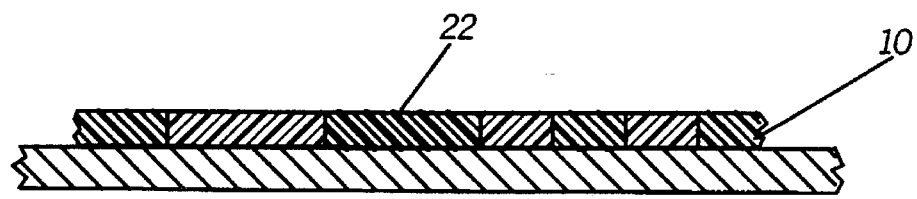

In the next step as shown in FIG. 4, another or a second portion 22 of the photoresist layer 10 is exposed (step 50) to ultraviolet light for a period of time sufficient to further degrade it. The ultraviolet light energy serves to partially break down the photopolymer chain, thereby rendering the degraded photopolymer more soluble in a developing solution. The second portion 22 exposed to ultraviolet light is typically selected to be representative of a desired pattern. The pattern is created by exposing the selected portions 22 with a laser beam. The proper time for exposing the photoresist will be depend upon the light intensity, the temperature, the photopolymer type, the thickness, and the type of equipment being used. Typical exposure times for various photoresists may be obtained from the manufacturer's data sheets. The light frequency needed for exposure typically varies between 200 and 600 nanometers, and is more preferentially found to be around 320 to 340 nanometers. Exposure tests should be run in order to establish the proper time and intensity of exposure so that the second portion 22 will be totally removed during the developing step. Again, a latent image is provided in the photopolymer film at this point.

The photoresist or photopolymer film 10 is then developed (step 60). Typical developers are alkali/water solutions, chlorinated solvent blends, or other types of chemical solutions which dissolve the degraded photoresist. The developer dissolves the exposed photoresist very quickly, the partially heated photoresist less quickly, and the unexposed or unheated portions of the photoresist even more slowly.

Figure 5:
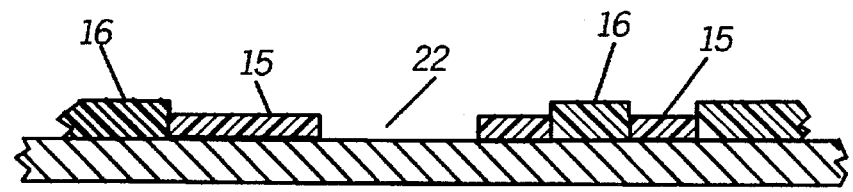

The net result is that the differential etching created by layers of photoresist having varying degrees of cure allows one to selectively remove only the upper section of the resist that was selectively heated. Although it might be expected that all portions would be attacked or removed by the developer to some extent, in practice, by controlling the time of development and the developer chemistry, one can selectively remove only certain portions without removing other portions, thus creating a step feature. Proper control of the developing regimen results in a situation where the exposed second portions are completely removed, the portions that were not heated nor exposed are unaffected, and only the upper section of the heated first portion is removed. When using an alkali water solution for developing, a water rinse is applied to the developed photoresist in order to remove any residual chemicals. The result of the developing step may be seen in FIG. 5, where the step features of the photoresist are found. The second portion 22 that was exposed to ultraviolet light has been developed completely through the film thickness, thereby exposing the underlying substrate. Those portions 15 that were selectively heated have only been partially developed, because they were less soluble in the developer than second portion 22, thus creating the step feature in the photoresist. Areas 16 that were not heated or not exposed have not been affected by the developing solution and are at their full thickness.

In addition, a final step of further curing the film may be performed in order to provide a more stable and consistent resulting product. Typically, a 100° C. bake for 15–45 minutes is employed. High-temperature baking (in excess of 120° C.) should be avoided because it could be harmful to the photoresist.

It can be appreciated from the foregoing that multi-dimensional features can be created in a photopolymeric film, thereby creating a stepped feature in the film. In order to do this, the coating need only be applied a single time, as opposed to the multiple passes required by the conventional art. Also in the prior art, heat is typically applied to the entire coating strictly for the purpose of removing solvents. Care is always taken to uniformly treat the entire film so that it develops completely and uniformly throughout. The instant invention selectively treats portions of the photopolymeric film in at least two different ways in order to create zones having varying solubility in a developing solution.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A method of forming a pattern with stepped features in a photopolymer, comprising the following steps in the order named:
   a) providing a single layer of a photopolymer film;
   b) heating the photopolymer film at a first temperature;
   c) heating only selected first portions of the photopolymer film at a second temperature, the second temperature being greater than the first temperature;
   d) exposing selected second portions of the photopolymer film to a laser beam; and
   e) developing the photopolymer film under conditions sufficient to completely remove the exposed second portions and to remove only an upper section of the heated first portions.

2. The method as described in claim 1, wherein step (b) comprises soft baking the photopolymer film.

3. The method as described in claim 1, wherein the selected first portions of the photopolymer film are heated by a laser.

4. The method as described in claim 1, wherein the photopolymer film is photoresist.

5. A method of forming a pattern with stepped features in a photopolymer, comprising the following steps in the order named:
   a) providing a single layer of a positive photoresist on a substrate;
   b) heating all of the photoresist at a temperature to soft bake it;
   c) further heating only selected portions of the photoresist at a temperature sufficient to partially degrade the photoresist and render it partially soluble in a developing solution;
   d) exposing selected other portions of the photoresist to a laser beam so as to render the selected other portions to be completely soluble in the developing solution; and
   e) developing all of the photoresist in a developing solution under conditions sufficient to completely remove the portions exposed to the laser beam in step (d) and to remove only an upper section of the portions heated in step (c).

* * * * *